(12) United States Patent
Huang (10) Patent No.: US 11,495,523 B2
(45) Date of Patent: Nov. 8, 2022

(54) LEAD FRAME HAVING A DIE PAD WITH A PLURALITY OF GROOVES ON AN UNDERSIDE

(71) Applicant: CHANG WAH TECHNOLOGY CO., LTD., Kaohsiung (TW)

(72) Inventor: Chia-Neng Huang, Kaohsiung (TW)

(73) Assignee: CHANG WAH TECHNOLOGY CO., LTD, Kaohsiung (TW)

( * ) Notice: Subject to any disclaimer, the term of this patent is extended or adjusted under 35 U.S.C. 154(b) by 0 days.

(21) Appl. No.: 17/225,683

(22) Filed: Apr. 8, 2021

(65) Prior Publication Data

US 2022/0093494 A1 Mar. 24, 2022

(30) Foreign Application Priority Data

Sep. 18, 2020 (TW) .................................. 109212332

(51) Int. Cl.
| | | |
|---|---|---|
| H01L 23/495 | (2006.01) | |
| H01L 23/48 | (2006.01) | |
| H01L 21/00 | (2006.01) | |
| H01R 9/00 | (2006.01) | |
| H05K 7/18 | (2006.01) | |
| H01L 23/31 | (2006.01) | |
| H01L 23/00 | (2006.01) | |

(52) U.S. Cl.
CPC .... *H01L 23/49503* (2013.01); *H01L 23/3114* (2013.01); *H01L 23/4952* (2013.01); *H01L 23/49548* (2013.01); *H01L 23/49568* (2013.01); *H01L 23/562* (2013.01); *H01L 24/45* (2013.01); *H01L 24/85* (2013.01); *H01L 23/3107* (2013.01)

(58) Field of Classification Search
CPC ........... H01L 23/49503; H01L 23/3114; H01L 23/4952; H01L 23/49548; H01L 23/49568; H01L 24/45; H01L 24/49; H01L 24/85; H01L 23/562; H01L 23/3107; H01L 2924/181
See application file for complete search history.

(56) References Cited

U.S. PATENT DOCUMENTS

| | | | | |
|---|---|---|---|---|
| 6,329,706 | B1 * | 12/2001 | Nam ................. | H01L 23/49503 257/676 |
| 9,018,745 | B2 * | 4/2015 | Shimizu ................. | H01L 24/49 257/676 |
| 10,515,880 | B2 * | 12/2019 | Yao ...................... | H01L 23/3107 |
| 2006/0017143 | A1 * | 1/2006 | Shimanuki ............. | H01L 24/97 257/E21.504 |

(Continued)

*Primary Examiner* — Alonzo Chambliss
(74) *Attorney, Agent, or Firm* — Muncy, Geissler, Olds & Lowe, P.C.

(57) ABSTRACT

A lead frame is made of conductive material, and includes an interconnecting web portion and a plurality of unit lead frames. Each unit lead frame includes a die pad and a plurality of leads. The die pad has a die-attach section disposed below an upper surface of the interconnecting web portion, and a plurality of extension sections bent at an angle from a periphery of the die-attach section and projecting to the interconnecting web portion. The die pad is formed with a plurality of grooves formed at an underside of junctions of the die-attach section and the extension sections. The leads extend from the interconnecting web portion toward and are spaced apart from the die pad.

10 Claims, 9 Drawing Sheets

(56) References Cited

U.S. PATENT DOCUMENTS

| | | | | |
|---|---|---|---|---|
| 2009/0250796 A1* | 10/2009 | Tsui | ............... | H01L 23/49582 |
| | | | | 257/676 |
| 2011/0300670 A1* | 12/2011 | Tanaka | ............ | H01L 23/49548 |
| | | | | 438/122 |
| 2013/0307000 A1* | 11/2013 | Ikenaga | .............. | H01L 33/486 |
| | | | | 257/91 |

* cited by examiner

LEAD FRAME HAVING A DIE PAD WITH A PLURALITY OF GROOVES ON AN UNDERSIDE

CROSS-REFERENCE TO RELATED APPLICATIONS

This application claims priority of Taiwanese Utility Model Patent Application No. 109212332, filed on Sep. 18, 2020.

FIELD

The disclosure relates to a lead frame, in particular to an exposed pad lead frame.

BACKGROUND

Figure 1:
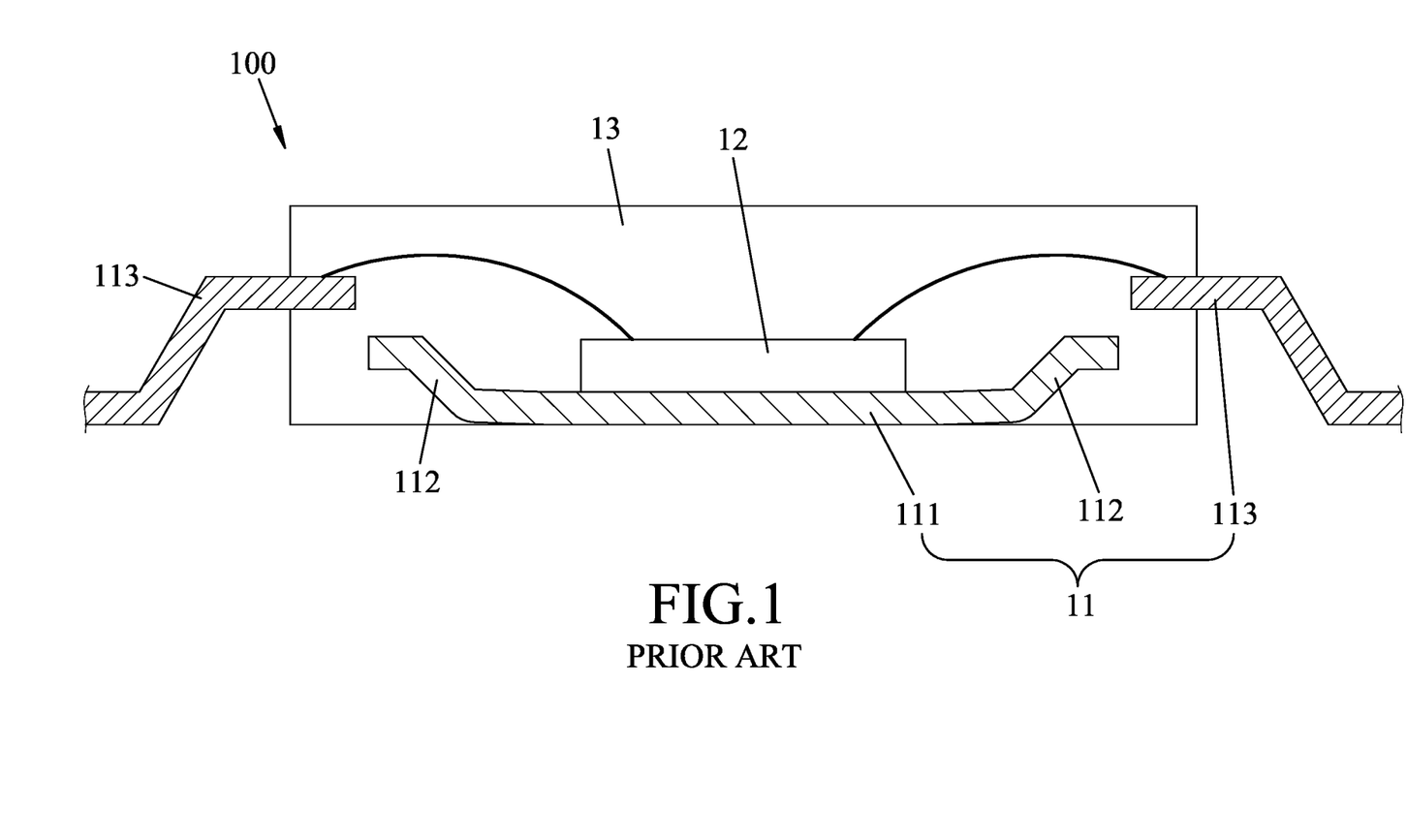
FIG. 1 is a diagrammatic cross-sectional view of an existing package component.

In the packaging industry, lead frames are commonly used in integrated circuit packaging including, for example, Quad Flat Package (QFP), Small Outline Package (SOP), Thin Small Outline Package (TSOP), etc. Referring to FIG. 1, an existing package component 100 generally includes a lead frame 11, a die 12, and a compound 13 which encapsulates the die 12 and the lead frame 11 after being cured. The lead frame 11 has a die-attach portion 111 for carrying the die 12, a plurality of peripheral extensions 112 extended from the die-attach portion 111, and a plurality of leads 113 exposed out of the compound 13 for external electrical connection of the die 12. The package component 100 is packaged by the compound 13 into an exposed pad type package (that is, the bottom surface of the die-attach portion 111 is exposed, as shown in FIG. 1), or a normal package (that is, the compound overlays the bottom surface of the die-attach portion 111, not shown).

Figure 2:
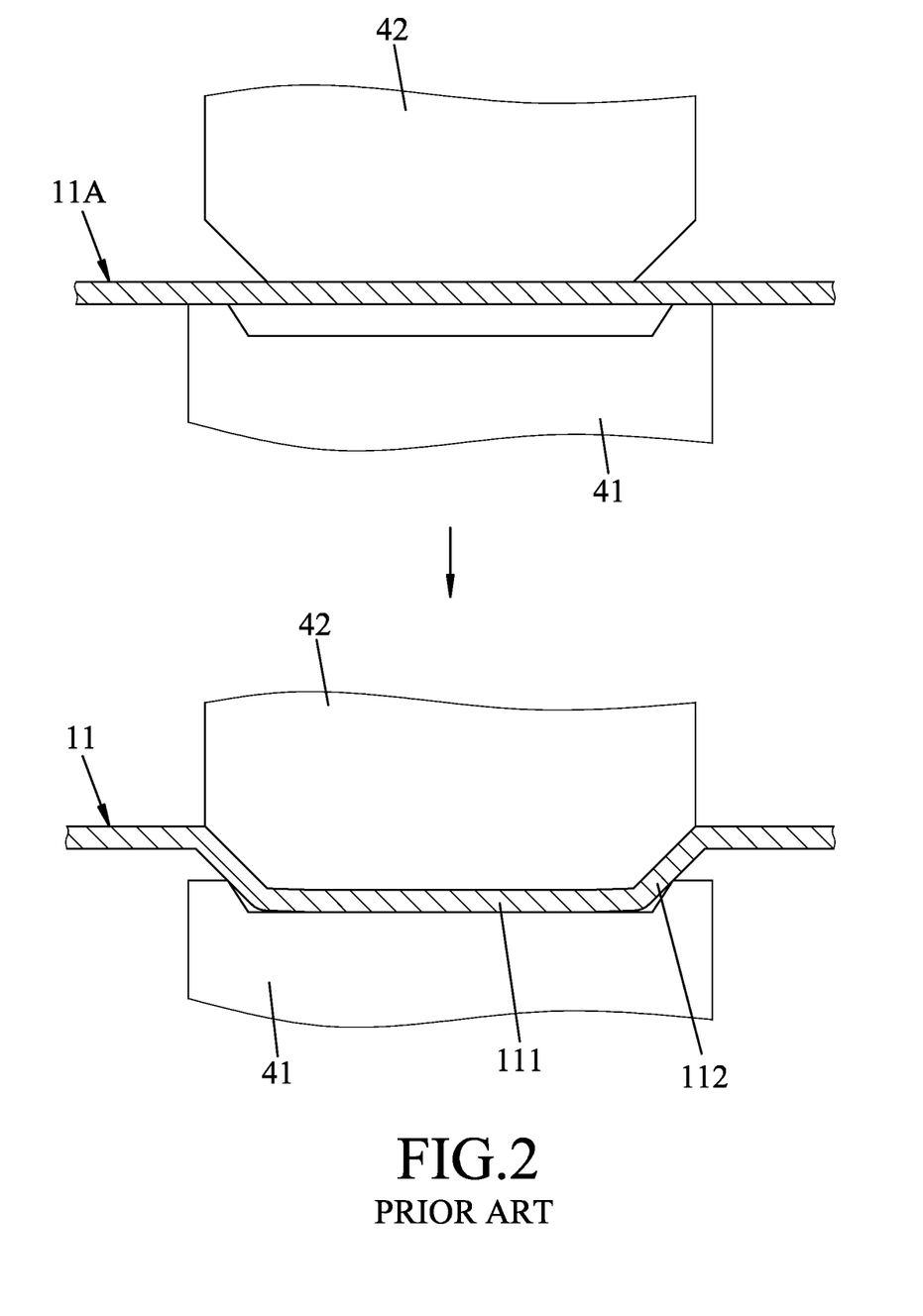
FIG. 2 is a diagrammatic overview of a process showing forming the existing package component.

With reference to FIGS. 1 and 2, in the manufacture of the aforementioned lead frame 11, a lead frame preform 11A, which has the top surface of the die-attach portion 111 and the leads 113 on the same plane, is placed into a stamping press. With the cooperation of a punch 42 and a lower die 41 of the stamping press, the die-attach portion 111 of the lead frame preform 11A is pressed downward by the punch 42, so that the junction of the die-attach portion 111 and the extensions 112 is bent, and that the die-attach portion 111 and the leads 113 are located at different heights. The lead frame 11 is then undergoing die bonding and wire bonding, and subsequently the die 12 and the lead frame 11 are packaged by compound 13 to obtain the package component 100 with exposed pad. However, a round corner is prone to form at the junction of the die-attach portion 111 and the extensions 112 after stamping and bending, which leads to a poor attachment of the die-attach portion 111 to an inner surface of a packaging mold (not shown) and with gaps being left therebetween. Therefore, the compound 13 may form mold flash on the bottom surface of the die-attach portion 111 during the packaging process, which could result in reduced exposed surface of the die-attach portion 111, and worsen the overall heat dissipation of the package component 100, as well as, disadvantage the surface characteristic of the package component 100 in subsequent connecting with other components.

SUMMARY

Therefore, the object of the disclosure is to provide a lead frame that can prevent the mold flash during the packaging process.

According to the disclosure, a lead frame is made of conductive material, and includes an interconnecting web portion and a plurality of unit lead frames. The interconnecting web portion is in a crisscross pattern, and is configured complementarily to the unit lead frames. Each of the unit lead frames includes a die pad and a plurality of leads. The die pad has a die-attach section that is disposed below an upper surface of the interconnecting web portion, and a plurality of extension sections that are bent at an angle from a periphery of the die-attach section and that project upward to the interconnecting web portion. The die pad is formed with a plurality of grooves that are formed at an underside of junctions of the die-attach section and the extension sections. Each groove has a portion that is formed in the die-attach section and another portion that is formed in a respective one of the extension sections. The leads extend from the interconnecting web portion toward and are spaced apart from the die pad.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the present invention is described in greater detail, it should be noted that where considered appropriate, reference numerals or terminal portions of reference numerals have been repeated among the figures to indicate corresponding or analogous elements, which may optionally have similar characteristics.

Figure 3:
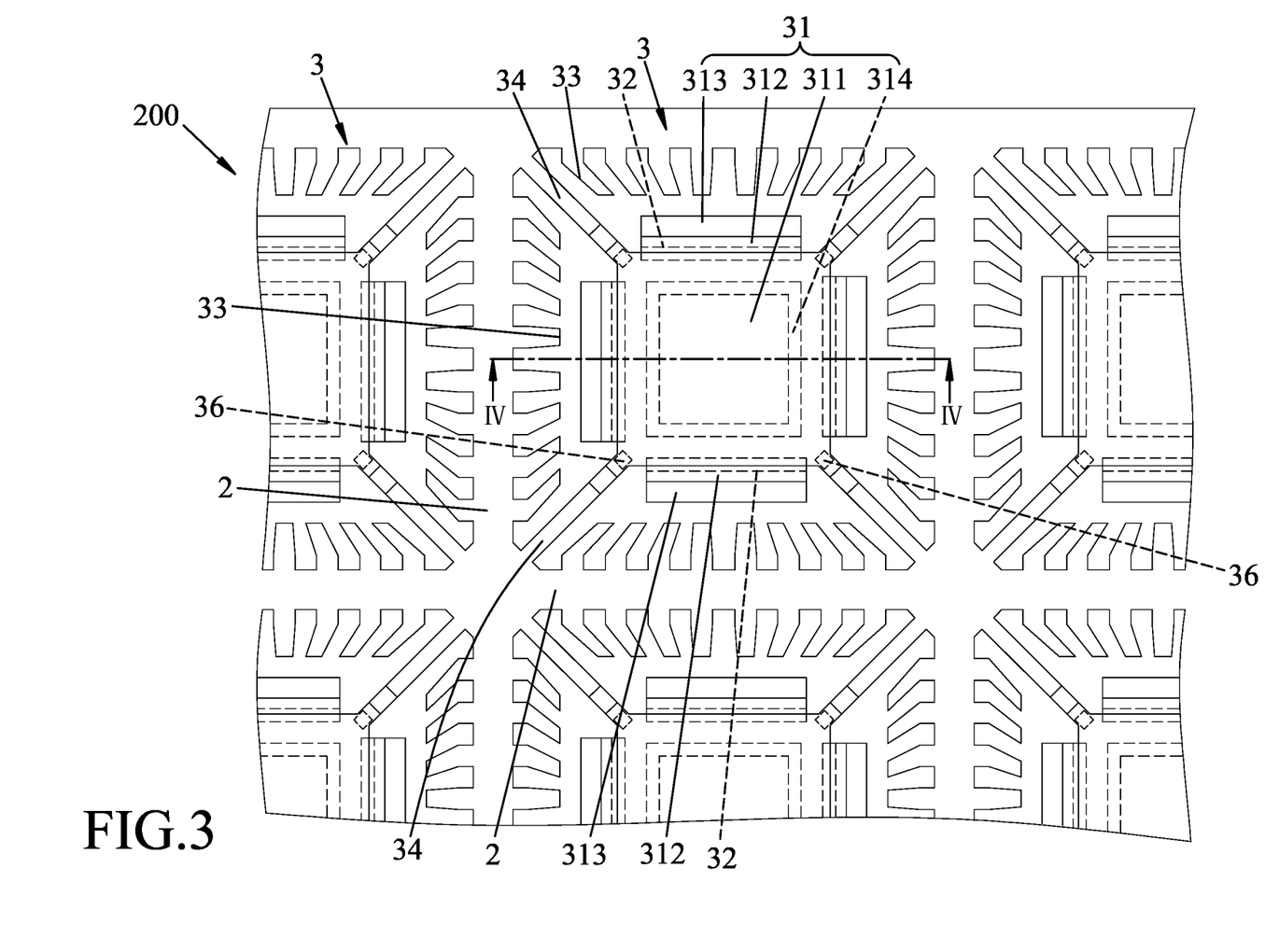
FIG. 3 is diagrammatic top view illustrating an embodiment of a lead frame according to the disclosure.
Figure 4:
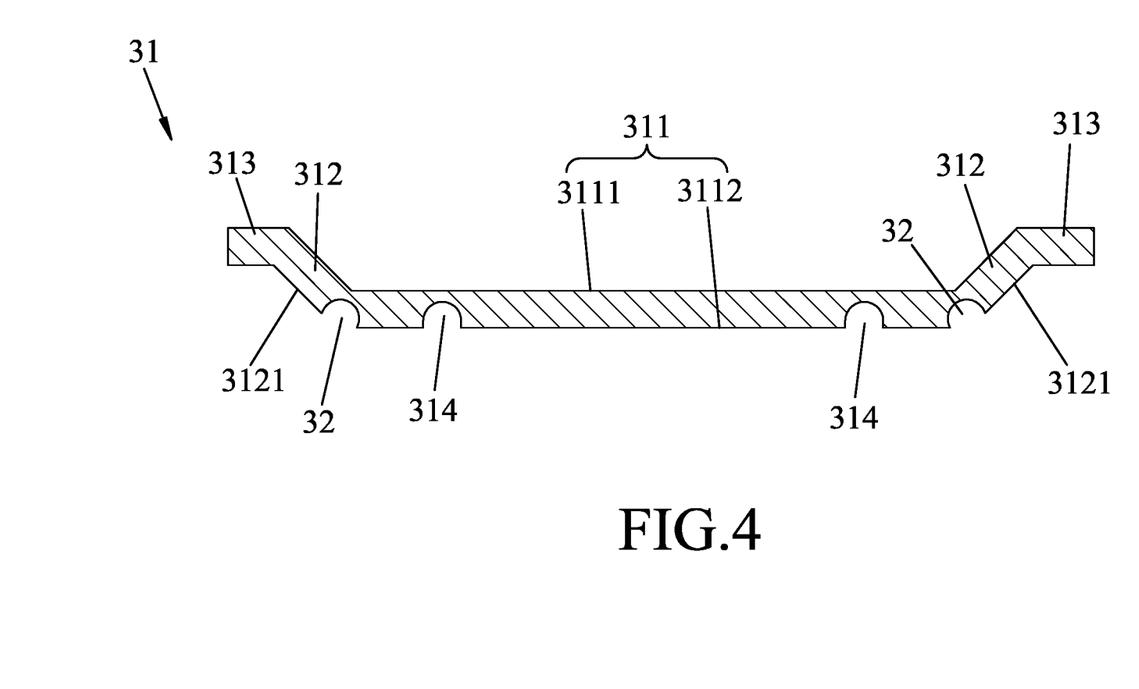
FIG. 4 is a cross-sectional view taken along line IV-IV in FIG. 3, illustrating a die pad of a unit lead frame of this embodiment having U-shaped grooves.

As shown in FIGS. 3 and 4, according to the present disclosure, the lead frame 200 is made of conductive materials such as copper-based alloys or iron-nickel alloys, and includes a plurality of unit lead frames arranged in arrays, and an interconnecting web portion 2 that is in a crisscross pattern and that is configured complementarily to the unit lead frames 3.

The interconnecting web portion 2 has an upper surface and a lower surface. Each unit lead frame 3 includes a die pad 31 formed with a plurality of grooves 32. The die pad 31 further includes a plurality of leads 33 and a plurality of tie bars 34.

The die pad 31 of each unit lead frame 3 has a square die-attach section 311, a plurality of extension sections 312, and a plurality of flap sections 313.

The die-attach section 311 is disposed below the upper surface of the interconnecting web portion 2, and has a top surface 3111 for carrying a die, a first bottom surface 3112 opposite to the top surface 3111, and at least one indentation 314 recessed from the first bottom surface 3112 of the die-attach section 311. The at least one indentation 314 may be a plurality of separate strip indentations disposed adjacent to the perimeter of the first bottom surface 3112 of the die-attach section 311, or may be an annular indentation disposed around the perimeter of the first bottom surface 3112 of the die-attach section 311. In this embodiment, the at least one indentation 314 is illustrated by taking an annular indentation as an example. The annular indentation 314 behaves as a pocket for containing solder flowed on the first bottom surface 3112 of the die-attach section 311 to prevent spilling from the die pad 31 when the unit lead frames 31 that had been undergone packaging to form package components are soldered with other components. In actual implementation, however, the indentations 314 may either not be formed, depending on circumstantial requirements.

Each extension section 312 is bent at an angle from a periphery of the die-attach section 311 to project upward and projects upward to the interconnecting web portion 2, and has a second bottom surface 3121 directly connected to the first bottom surface 3112. Each flap section 313 extends from an end of a respective one of the extension sections 312 that is distal from the die-attach section 311, and are parallel to and spaced apart from (i.e., not connected to) the leads 33. It should be noted that the extension sections 312 should at least formed on two opposite sides of the die-attach section 311 so as to provide balanced support required by the stamping process. In this embodiment, there are four extension sections 312 formed respectively on four sides of the square die-attach section 311, but in actual implementation, as mentioned above, the extension sections 312 may also be formed only on the opposite two sides of the die-attach section 311.

In some embodiments, each of the extension sections 312 projects rectilinearly to the upper surface of the interconnecting web portion 2 from the die-attach section 311 with constant thickness.

Figure 8:
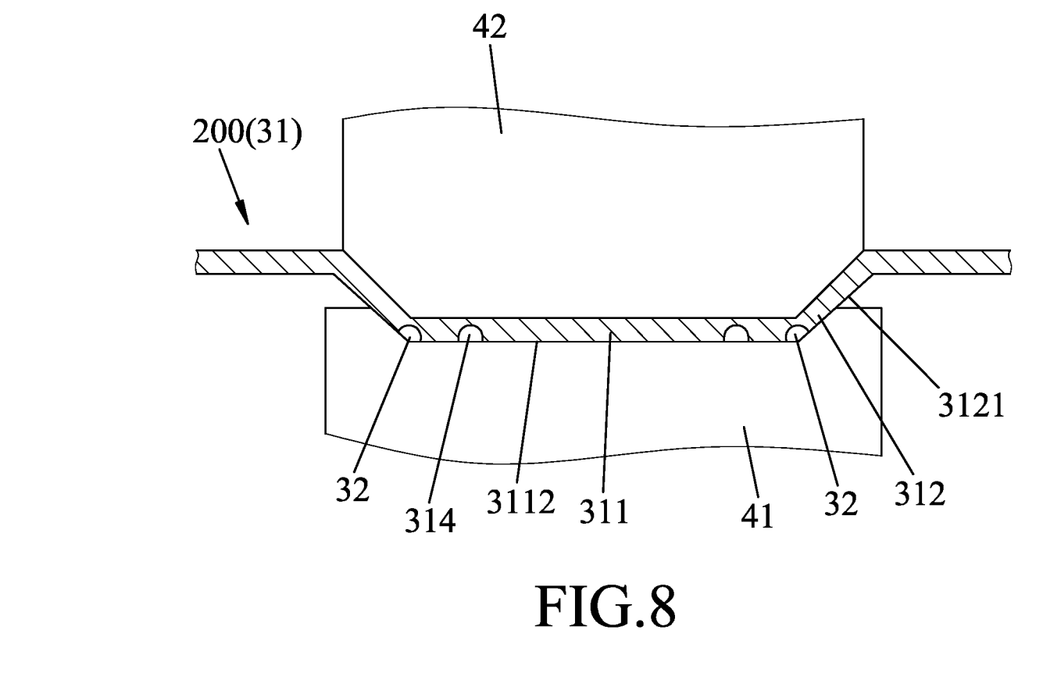
FIG. 8 is a diagrammatic cross-sectional view illustrating a variation of forming the unit lead frame.

With reference to FIG. 8, each of the extension sections 312 may project to the interconnecting web portion 22 from the die-attach section 311 with gradually increased thickness, and the thickness of each extension section 312 at the end connected to the die-attach section 311 is 0.8 to 0.9 times the thickness at the opposite end. Such configuration can improve the formability of the lead frame 200.

Figure 5:
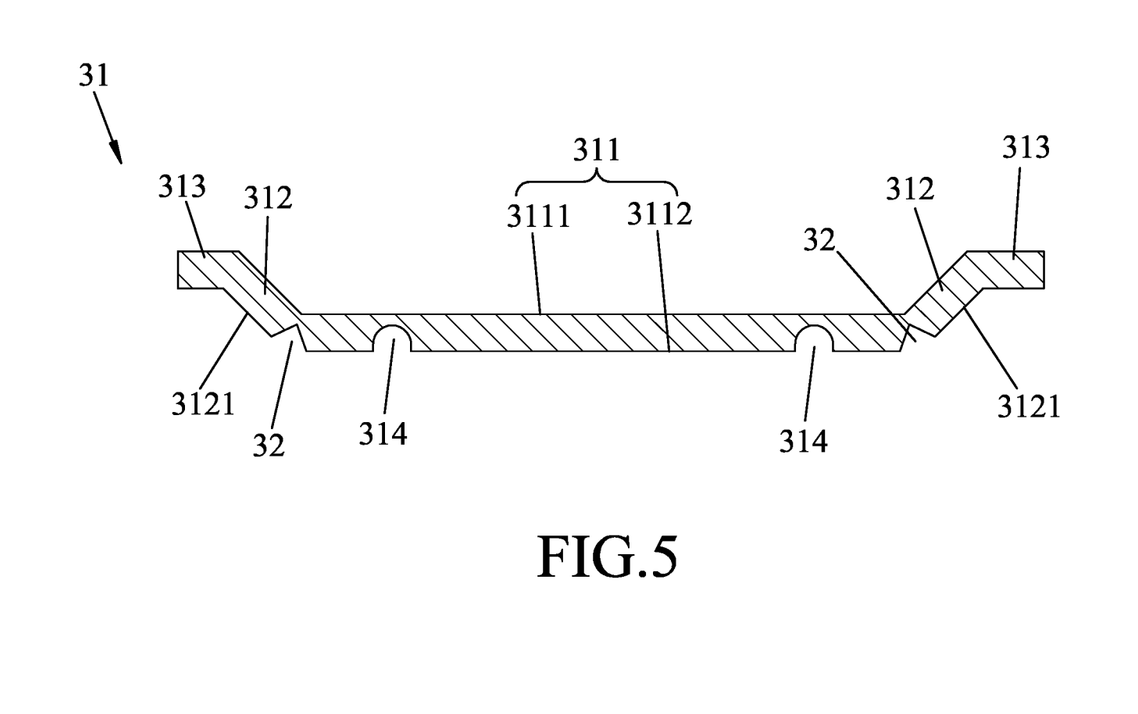
FIG. 5 is a view similar to FIG. 4, but illustrating the die pad having V-shaped grooves.
Figure 6:
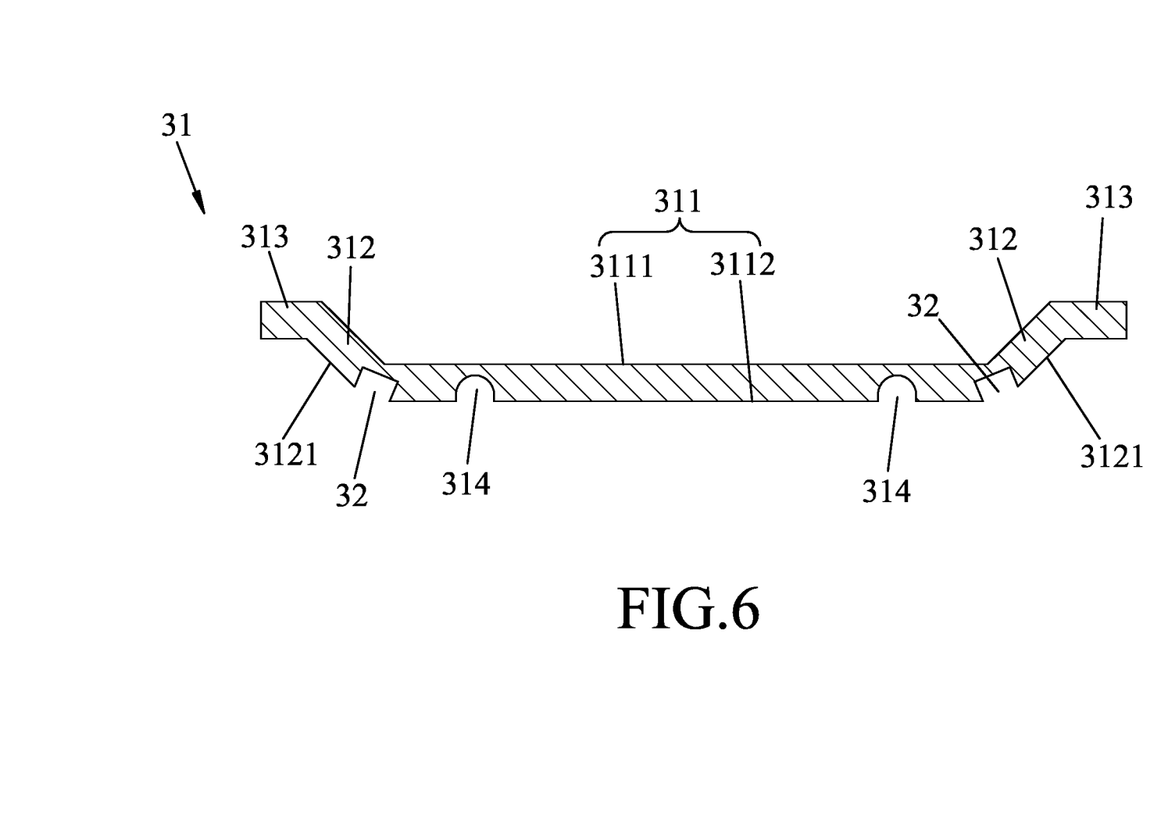
FIG. 6 is another view similar to FIG. 4, but illustrating the die pad having square grooves.

The grooves 32 are formed at an underside of junctions of the die-attach section 311 and the extension sections 312. Each groove 32 recessed from both the first bottom surface 3112 of the die-attach section 311 and the second bottom surface 3121 of a respective one of the extension sections 312. Specifically, each groove 32 has a portion that is formed in the die-attach section 311 and another portion that is formed in the respective one of the extension sections 312. In some embodiments, a depth of each of the grooves 32 is not greater than two-thirds of the thickness of the die-attach section 311 in order to avoid insufficient structural strength or breaking of the extension sections 312 during the stamping and bending process. In addition, it should be noted that the grooves 32 provides notches at the bent areas where the die-attach section 311 and the extension sections 312 meet, thus the thickness at the bent areas is reduced, such that the formation of round corners due to residual stress effects associated with the abovementioned prior art can be prevented. Accordingly, the grooves 32 may be provided in different forms. For example, the grooves 32 may be U-shaped grooves as shown in FIG. 4, or inverted V-shaped grooves as shown in FIG. 5, or alternatively may be of square cross grooves as shown in FIG. 6. Other shapes of grooves that are conceivable by one skilled in the art are also feasible.

The leads 33 extend at intervals from the interconnecting web portion 2 toward and are spaced apart from the die pad 31.

The tie bars 34 respectively extend from four corners of the die-attach section 311 to the interconnecting web portion 2 and serve to support the die-attach section 311. The junction of the tie bars 34 and the die-attach section 311 are bent at an angle, and the unit lead frame 3 further has bar grooves 36 that are formed at an underside of junctions of the tie bars 34 and the die-attach section 311.

The lead frame 200 is obtained by stamping a lead frame preform 200A to bend the die-attach section 311 with respect to the extension sections 312 at a predetermined angle.

Figure 7:
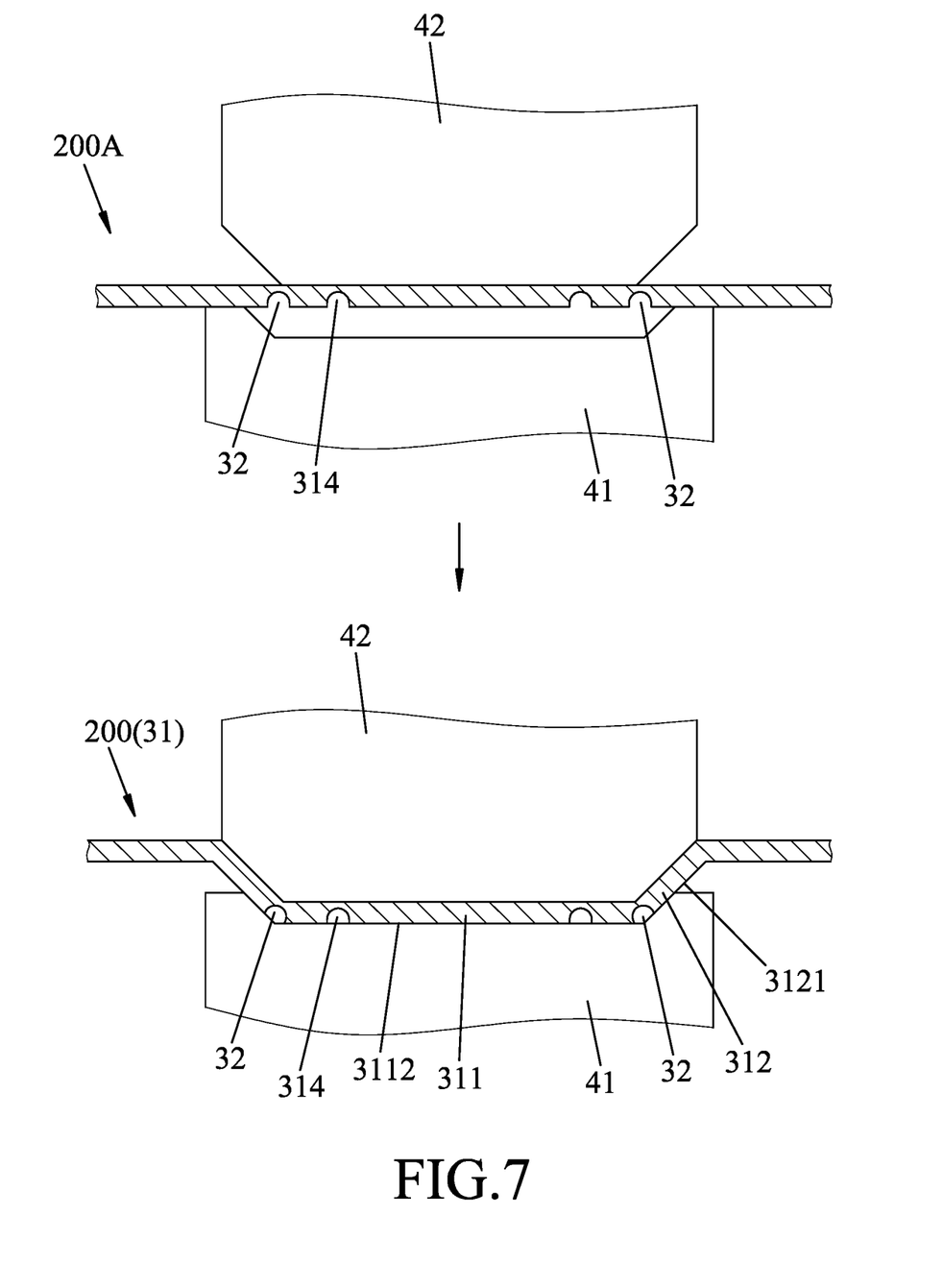
FIG. 7 is a diagrammatic cross-sectional view illustrating a process of forming a unit lead frame of this embodiment from a unit lead frame preform according to the disclosure.

Referring to FIGS. 7 and 8, particularly, the stamping process involves providing a lead frame preform 200A which is made of a copper alloy or iron-nickel alloy and has the die pads 31 and the interconnecting web portion 2 are on the same plane, and placing the lead frame preform 200A into a stamping press. With the cooperation of a lower die 41 and a punch 42 of the stamping press, the lead frame preform 200A is stamped and bent at the junctions of the die-attach section 311 and the extension sections 312 with a predetermined angle to result in a die pads 31 of the lead frame 200. The grooves 32 reduce the thickness of the lead frame preform 200A at the corresponding positions, so that the formation of a round corner at the bent junctions of the extension sections 312 and the die-attach section 311 due to residual stress effects after stamping and bending can be avoided.

The stamping press of various designs can be used according to different requirements. For example, during the stamping process, the extension sections 312 of the lead frame assemblage preform 200A, when subjected to the pressure applied by the punch 42, can be squeezed to form a tapered thickness toward the corresponding die-attach section 311, and thus results in a lead frame 200 as shown in FIG. 8. Particularly, the thickness of the extension sections 312 can be made decrease progressively in the direction toward the die-attach section 311 through an ununiform punch pressure which emphasizes the pressure load toward the bent corner of the die pad 31 to render a slight plastic deformation of the extension sections 312 and result in the tapered thickness thereof, such that the formability of the lead frame 200 can be improved. In addition, a predetermined bending angle can be formed on the junction of the die pad 31 and each extension section 312 with sufficient deformation, so that in the subsequent packaging process, the die-attach section 311 can be more closely attached to the packaging mold.

Figure 9:
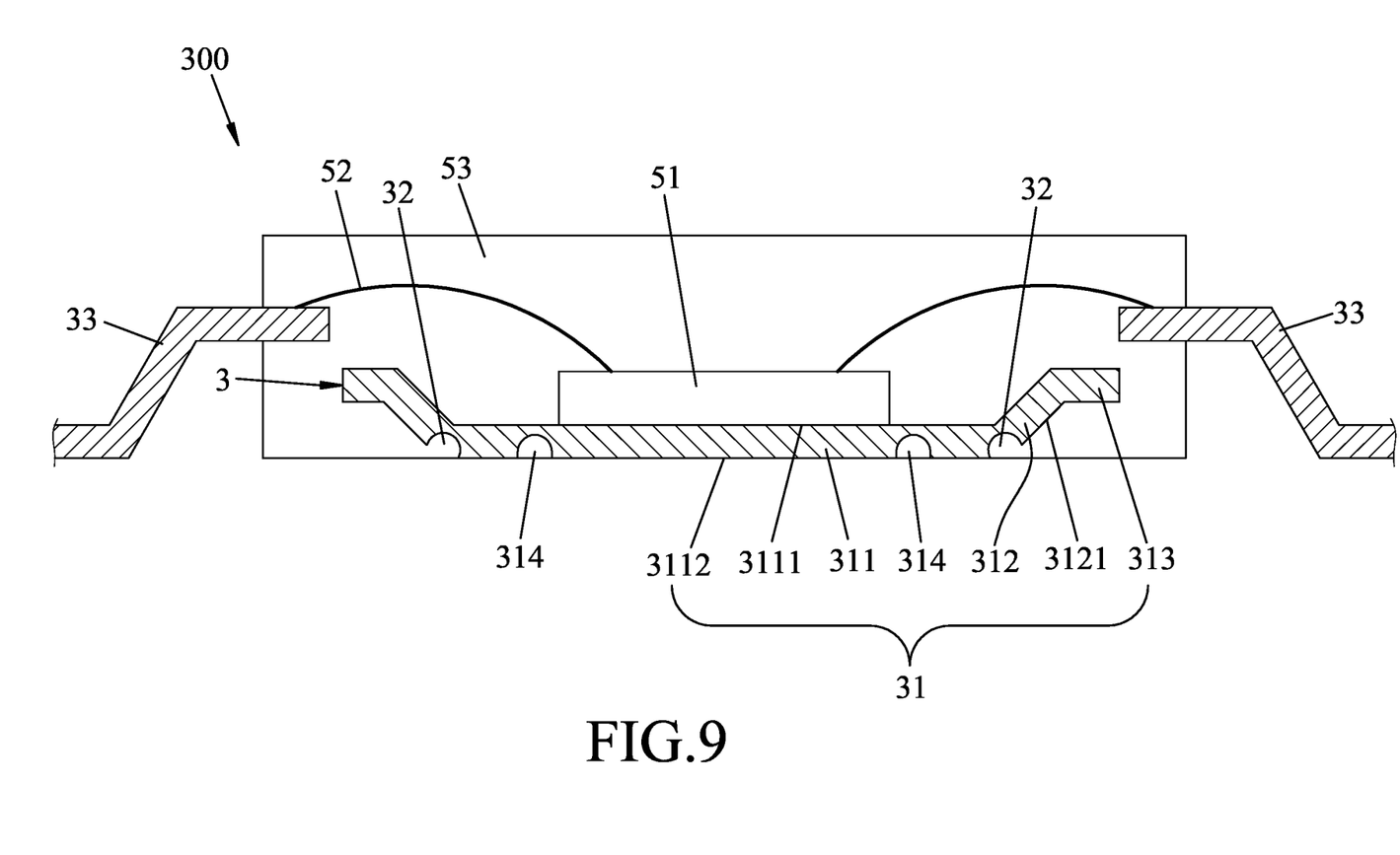
FIG. 9 is a diagrammatic cross-sectional view illustrating a package component with the lead frame of the disclosure.

Referring to FIGS. 3 and 9, a package component 300 resulted after the packaging and slicing processes of the lead frame 200 includes the aforesaid unit lead frame 3, a semiconductor die 51, a plurality of wires 52, and a molded compound 53.

The semiconductor die 51 is disposed on the top surface 3111 of the die-attach section 311, and the plurality of wires 52 are electrically connected between the semiconductor die 51 and the corresponding leads 33. The molded compound 53 encapsulates the semiconductor die 51 and the die pad 31, with the first bottom surface 3112 of the die-attach section 311 of the die pad 31 and the leads 33 exposed outside of the molded compound 53, and a portion of the molded compound 53 is filled in the grooves 32.

Particularly, to obtain the aforementioned package component 300, the lead frame 200 with the semiconductor die 51 attached along with the wires 52 is first placed into a packaging mold (not shown) with the first bottom surface 3112 of the die-attach section 311 being placed to attach to the packaging mold. Afterward, the molded compound 53 is formed through injection molding of an encapsulating compound. Finally, package components 300 as shown in FIG. 9 can be obtained after singulation. Since no gaps are left between the first bottom surface 3112 of the die-attach section 311 of the lead frame 200 and the packaging mold, no mold flash of the encapsulating compound will have resulted on the first bottom surface 3112 of the die-attach section 311 during injection of the encapsulating compound. Therefore, the problem of the mold flash can be avoided.

In summary, the grooves 32 formed at the junction of the die-attach section 311 and the extension sections 312 reduces the thickness of the lead frame 200 at the corresponding positions such that the formation of a round corner due to residual stress effects can be prevented. Therefore, during the subsequent packaging process, no gaps will be left between the die pad 31 and the packaging mold, and the mold flash on the first bottom surface 3112 of the die-attach section 311 can be prevented. Accordingly, heat dissipation area provided by the exposure of the first bottom surface 3112 of the die-attach section 311 will not be reduced due to mold flash, and the present invention can indeed achieve the intended purpose.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A lead frame made of conductive material and comprising:
    an interconnecting web portion that is in a crisscross pattern; and
    a plurality of unit lead frames, said interconnecting web portion being configured complementarily to said unit lead frames, each of said unit lead frames including
        a die pad that has a die-attach section being disposed below an upper surface of said interconnecting web portion, and a plurality of extension sections bent at an angle from a periphery of said die-attach section and projecting upward to said interconnecting web portion, said die pad being formed with a plurality of grooves that are formed at an underside of junctions of said die-attach section and said extension sections, each groove having a portion that is formed in said die-attach section and another portion that is formed in a respective one of said extension sections, and
        a plurality of leads extending from said interconnecting web portion toward and spaced from said die pad;
    wherein, for each unit lead frame, each extension section projects to said interconnecting web portion from said die-attach section with gradually increased thickness.

2. The lead frame as claimed in claim 1, wherein a depth of each of said grooves is not greater than two-thirds of a thickness of said die-attach section.

3. The lead frame as claimed in claim 1, wherein, for each unit lead frame, each extension section has a thickness at the end which is connected to said die-attach section that is 0.8 to 0.9 times as much as a thickness at the opposite end.

4. The lead frame as claimed in claim 1, wherein said grooves are U-shaped grooves.

5. The lead frame as claimed in claim 1, wherein said grooves are of inverted V-shaped grooves.

6. The lead frame as claimed in claim 1, wherein said grooves are of square grooves.

7. The lead frame as claimed in claim 1, wherein said die pad of each unit lead frame further has a plurality of flap sections, each extending from an end of a respective one of said extension sections which is distal from said die-attach section, and being parallel to and spaced from said leads.

8. The lead frame as claimed in claim 1, wherein, for each unit lead frame, said die-attach section of each die pad has a top surface for supporting a die, a first bottom surface opposite to said top surface, and at least one indentation recessed from said first bottom surface.

9. The lead frame as claimed in claim 1, wherein, for each unit lead frame, said extension sections are formed at least on two opposite sides of said die-attach section.

10. The lead frame as claimed in claim 1, wherein each unit lead frame further has a plurality of tie bars extending from a periphery of said die-attach section to said interconnecting web portion, each unit lead frame further having bar grooves that are formed at an underside of junctions of said tie bars and said die-attach section.

* * * * *